United States Patent
Kanno

(10) Patent No.: US 12,107,125 B2
(45) Date of Patent: Oct. 1, 2024

(54) OXIDE SEMICONDUCTOR FILM AND SEMICONDUCTOR DEVICE

(71) Applicant: FLOSFIA INC., Kyoto (JP)

(72) Inventor: Ryohei Kanno, Kyoto (JP)

(73) Assignee: FLOSFIA INC., Kyoto (JP)

( * ) Notice: Subject to any disclaimer, the term of this patent is extended or adjusted under 35 U.S.C. 154(b) by 74 days.

(21) Appl. No.: 17/573,790

(22) Filed: Jan. 12, 2022

(65) Prior Publication Data

US 2022/0140083 A1 May 5, 2022

Related U.S. Application Data

(63) Continuation-in-part of application No. PCT/JP2020/026642, filed on Jul. 8, 2020.

(30) Foreign Application Priority Data

Jul. 12, 2019 (JP) .................................. 2019-130616

(51) Int. Cl.
*H01L 29/12* (2006.01)
*C23C 16/40* (2006.01)
(Continued)

(52) U.S. Cl.
CPC ............ *H01L 29/12* (2013.01); *C23C 16/403* (2013.01); *H01L 29/7393* (2013.01);
(Continued)

(58) Field of Classification Search
CPC ... H01L 29/12; H01L 29/7393; H01L 29/778; H01L 29/808; H01L 29/812;
(Continued)

(56) References Cited

U.S. PATENT DOCUMENTS

2013/0059414 A1* 3/2013 Kim .................... H01B 1/08
252/518.1
2014/0217470 A1 8/2014 Sasaki et al.
(Continued)

FOREIGN PATENT DOCUMENTS

JP WO2013/035843 3/2013
JP WO2015/005202 1/2015
(Continued)

OTHER PUBLICATIONS

International Search Report issued Aug. 25, 2020 in International (PCT) Application No. PCT/JP2020/026642.
(Continued)

*Primary Examiner* — Shahed Ahmed
(74) *Attorney, Agent, or Firm* — Wenderoth, Lind & Ponack, L.L.P.

(57) ABSTRACT

A first raw material solution containing at least aluminum is atomized to generate first atomized droplets and a second raw material solution containing at least gallium and a dopant is atomized to generate second atomized droplets, and subsequently, the first atomized droplets are carried into a film forming chamber using a first carrier gas and the second atomized droplets are carried into the film forming chamber using a second carrier gas, and then the first atomized droplets and the second atomized droplets are mixed in the film forming chamber, and the mixed atomized droplets are thermally reacted in the vicinity of a surface of the base to form an oxide semiconductor film on the base, the oxide semiconductor film including, as a major component, a metal oxide containing at least aluminum and gallium, wherein the oxide semiconductor film has a mobility of no less than 5 $cm^2/Vs$.

12 Claims, 8 Drawing Sheets

(51) Int. Cl.
    *H01L 29/739* (2006.01)
    *H01L 29/778* (2006.01)
    *H01L 29/808* (2006.01)
    *H01L 29/812* (2006.01)
    *H01L 29/872* (2006.01)
    *H01L 33/26* (2010.01)

(52) U.S. Cl.
    CPC .......... *H01L 29/778* (2013.01); *H01L 29/808* (2013.01); *H01L 29/812* (2013.01); *H01L 29/872* (2013.01); *H01L 33/26* (2013.01)

(58) Field of Classification Search
    CPC ..... H01L 29/872; H01L 33/26; H01L 29/045; H01L 29/0619; H01L 29/0843; H01L 29/7395; H01L 29/7786; H01L 29/7813; H01L 29/8083; H01L 33/42; H01L 29/78; H01L 29/24; H01L 21/20; H01L 21/02172–02194; H01L 21/02538–02549; C23C 16/40
    See application file for complete search history.

(56) References Cited

U.S. PATENT DOCUMENTS

| | | |
|---|---|---|
| 2016/0149005 A1 | 5/2016 | Oda et al. |
| 2018/0061952 A1* | 3/2018 | Tokuda ............... H01L 21/0242 |
| 2019/0074178 A1* | 3/2019 | Jinno ..................... C30B 29/16 |
| 2019/0157400 A1 | 5/2019 | Tanikawa et al. |

FOREIGN PATENT DOCUMENTS

| | | |
|---|---|---|
| JP | 2016-018900 | 2/2016 |
| JP | 2018-002544 | 1/2018 |
| JP | WO2018/004008 | 1/2018 |
| JP | 2018-035044 | 3/2018 |
| JP | 2019-046984 | 3/2019 |
| TW | 201926678 | 7/2019 |

OTHER PUBLICATIONS

International Search Report issued Aug. 25, 2020 in International (PCT) Application No. PCT/JP2020/026643.

Kaneko, Kentaro, "Growth and Physical Properties of Corundum-Structured Gallium Oxide Alloy Thin Films", Dissertation, Kyoto Univ., pp. 1-116, Mar. 2013 with English Abstract.

Hiroshi Ito et al., "Growth and Band Gap Control of Corundum-Structured $\alpha$-$(AlGa)_2O_3$ Thin Films on Sapphire by Spray-Assisted Mist Chemical Vapor Deposition", Jpn. J. Appl. Phys. 51, 2012, pp. 100207-1-100207-3.

Office Action issued Sep. 5, 2023 in corresponding Taiwanese Patent Application No. 109122991 with English-language translation.

* cited by examiner

OXIDE SEMICONDUCTOR FILM AND SEMICONDUCTOR DEVICE

CROSS REFERENCE TO RELATED APPLICATION

This application is a continuation-in-part application of International Patent Application No. PCT/JP2020/026642 (Filed on Jul. 8, 2020), which claims the benefit of priority from Japanese Patent Application No. 2019-130616 (filed on Jul. 12, 2019).

The entire contents of the above applications, which the present application is based on, are incorporated herein by reference.

1. FIELD OF THE INVENTION

The present disclosure relates to an oxide semiconductor film that is useful as a semiconductor, and more particularly, a semiconductor device and system using the oxide semiconductor film.

2. DESCRIPTION OF THE RELATED ART

As next-generation switching devices that enable ensuring high withstanding voltage, low loss, and high heat resistance, semiconductor devices in which gallium oxide ($Ga_2O_3$) having a wide band gap is used have been drawing attention and are expected to be applied to power semiconductor devices such as inverters. In addition, because of the wide band gap, application of such semiconductor devices to light emitting/receiving devices such as LEDs and sensors is expected. The band gap of the gallium oxide may be controlled via a mixed crystal formed by mixing indium and/or aluminum with the gallium oxide, which provides a highly attractive family of materials as InAlGaO-based semiconductors. Here, InAlGaO-based semiconductors indicate $In_X Al_Y Ga_Z O_3$ ($0 \leq X \leq 2, 0 \leq Y \leq 2, 0 \leq Z \leq 2, X+Y+Z=1.5$ to $2.5$) and may be regarded as a family of materials including gallium oxide.

In recent years, mixed crystals of gallium oxide and aluminum oxide have been studied. However, aluminum oxide has high insulating properties, is difficult to dope and has a mobility of around 1 to 2 $cm^2/Vs$ at most, and thus, it is difficult to obtain a mixed crystal of aluminum oxide and gallium oxide, the mixed crystal having excellent electrical properties. Therefore, an aluminum oxide-gallium oxide mixed crystal that has excellent electrical properties and is useful for a semiconductor device, etc., has been awaited.

SUMMARY OF THE INVENTION

According to an example of the present disclosure, there is provided an oxide semiconductor film including, a metal oxide as a major component containing at least aluminum and gallium; and a mobility of no less than 5 $cm^2/Vs$.

According to an example of the present disclosure, there is provided a semiconductor device including at least a semiconductor layer and an electrode, wherein the semiconductor layer is the above semiconductor film.

According to an example of the present disclosure, there is provided a semiconductor system including a semiconductor device, wherein the semiconductor device is the above semiconductor device.

Thus, according to an example of the present disclosure, there is provided an oxide semiconductor film, device or system having good electrical conductivity and excellent semiconductor properties.

DETAILED DESCRIPTION

Figure 1:
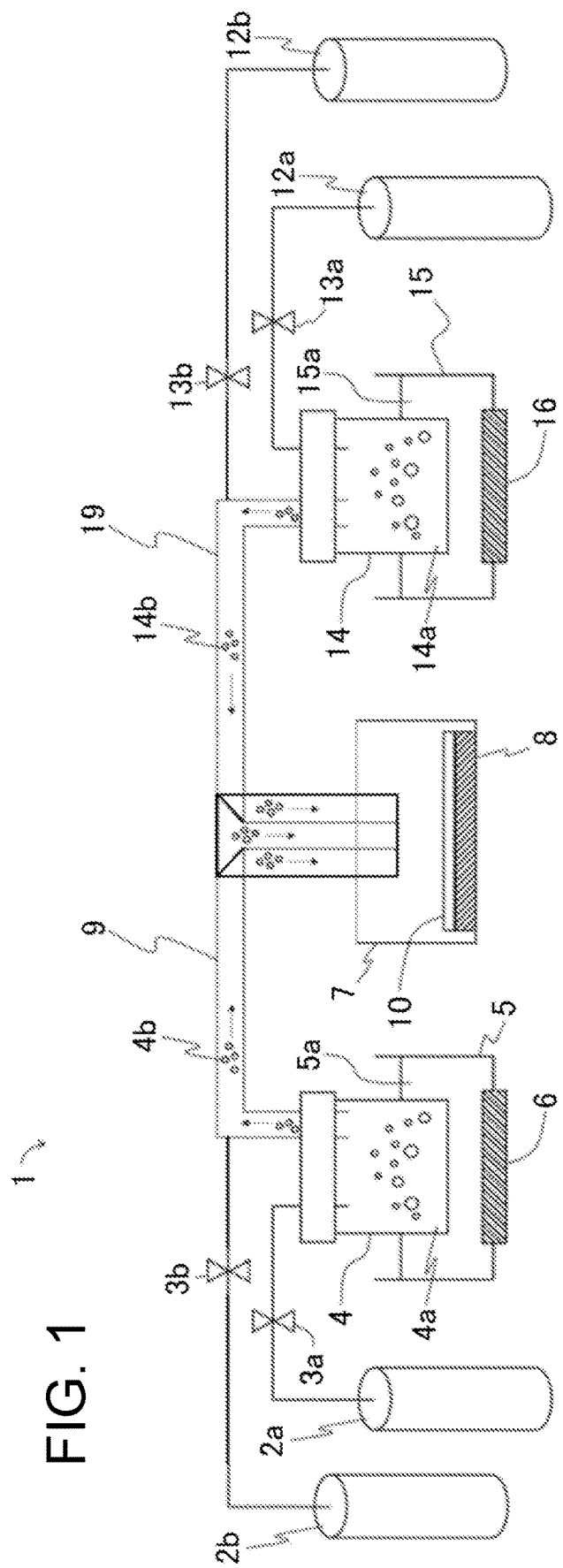
FIG. 1 is a schematic configuration diagram of a film forming apparatus used in examples of the present disclosure.

The present inventor has succeeded in creation of an oxide semiconductor film including, a metal oxide as a major component containing at least aluminum and gallium, and a mobility of no less than 5 $cm^2/Vs$, and found, for example, that the oxide semiconductor film thus obtained has excellent electrical properties and is useful for a semiconductor device, and thus found that the oxide semiconductor film may solve conventional problems.

Embodiments of the present disclosure will be described below with reference to the accompanying drawings. In the following description, the same parts and components are designated by the same reference numerals. The present embodiment includes, for example, the following disclosures.

[Structure 1]

An oxide semiconductor film including, a metal oxide as a major component containing at least aluminum and gallium; and a mobility of no less than 5 $cm^2/Vs$.

[Structure 2]

The oxide semiconductor film according to [Structure 1], further including a dopant.

[Structure 3]

The oxide semiconductor film according to [Structure 1] or [Structure 2] above, wherein the oxide semiconductor film has a film thickness of no less than 500 nm.

[Structure 4]

The oxide semiconductor film according to any of [Structure 1] to [Structure 3] above, wherein the oxide semiconductor film has a corundum structure.

[Structure 5]

The oxide semiconductor film according to any of [Structure 1] to [Structure 4] above, wherein an amount of the aluminum contained in the oxide semiconductor film is no less than 1 atom % relative to the gallium contained in the oxide semiconductor film.

[Structure 6]

The oxide semiconductor film according to any of [Structure 1] to [Structure 4] above, wherein an amount of the aluminum contained in the oxide semiconductor film is no less than 5 atom % relative to the gallium contained in the oxide semiconductor film.

[Structure 7]

The oxide semiconductor film according to [Structure 2] above, wherein the dopant is an n-type dopant.

[Structure 8]

The oxide semiconductor film according to [Structure 4] above, wherein a principal surface of the oxide semiconductor film is an m-plane.

[Structure 9]

The oxide semiconductor film according to any of [Structure 1] to [Structure 8] above, wherein the oxide semiconductor film has a band gap of no less than 5.5 eV.

[Structure 10]

A semiconductor device including at least a semiconductor layer and an electrode, wherein the semiconductor layer is the oxide semiconductor film according to any of [Structure 1] to [Structure 9] above.

[Structure 11]

A semiconductor system including a semiconductor device, wherein the semiconductor device is the semiconductor device according to [Structure 10] above.

An oxide semiconductor film of the present disclosure is an oxide semiconductor film including, a metal oxide as a major component containing at least aluminum and gallium; and a mobility of no less than 5 cm$^2$/Vs. The "oxide semiconductor film" is not specifically limited as long as the oxide semiconductor film is a film-like oxide semiconductor, and may be a crystal film or may be a non-crystal film. Where the oxide semiconductor film is a crystal film, the oxide semiconductor film may be a single-crystal film or may be a polycrystal film. In the present disclosure, it is preferable that the oxide semiconductor film be a mixed crystal. The "metal oxide" refers to a substance containing a metal element and oxygen. The "major component" means that a content of a metal oxide in all components of the oxide semiconductor film is preferably no less than 50%, more preferably no less than 70%, still more preferably no less than 90% in atom ratio and also means that the content of the metal oxide may be 100%. It is preferable that the oxide semiconductor film have a corundum structure. Also, the mobility refers to a mobility obtained by Hall effect measurement, and in an embodiment of the present disclosure, it is preferable that the mobility be no less than 5 cm$^2$/Vs and it is more preferable that the mobility be no less than 5 cm$^2$/Vs. Also, a carrier density of the oxide semiconductor film is not specifically limited, but in an embodiment of the present disclosure, is preferably no less than $1.0\times10^{16}$/cm$^3$ and no more than $1.0\times10^{20}$/cm$^3$, more preferably no less than $1.0\times10^{16}$/cm$^3$ and no more than $5.0\times10^{18}$/cm$^3$.

In an embodiment of the present disclosure, it is preferable that the oxide semiconductor film includes a dopant. The dopant may be a p-type dopant or may be an n-type dopant, but in an embodiment of the present disclosure, it is preferable that the dopant be an n-type dopant. Examples of the n-type dopant include, e.g., tin (Sn), germanium, silicon, titanium, zirconium, vanadium and niobium and combinations of any two or more of these elements. Examples of the p-type dopant include, e.g., Mg, H, Li, Na, K, Rb, Cs, Fr, Be, Ca, Sr, Ba, Ra, Mn, Fe, Co, Ni, Pd, Cu, Ag, Au, Zn, Cd, Hg, Tl, Pb, N and P and combinations of any two or more of these elements. In the present disclosure, the p-type dopant is preferably a group 1 metal or a group 2 metal in the periodic table, more preferably a group 2 metal in the periodic table, most preferably magnesium (Mg).

In an embodiment of the present disclosure, it is preferable that a film thickness of the oxide semiconductor film be no less than 500 nm because such film thickness enables provision of effects of properties of a semiconductor having a high withstanding voltage. Also, in an embodiment of the present disclosure, an amount of the aluminum contained in the oxide semiconductor film is preferably no less than 1 atom %, more preferably no less than 5 atom %, most preferably no less than 15 atom % relative to the gallium contained in the oxide semiconductor film. Such preferable range of the amount of the aluminum contained enables provision of the oxide semiconductor film each having a band gap of, for example, no less than 5.5 eV. Furthermore, combination of the preferable carrier density and the preferable amount of the aluminum contained, which have been described above, enables provision of the oxide semiconductor film having more excellent electrical properties even though having a band gap of no less than 5.5 eV. Also, in an embodiment of the present disclosure, it is preferable that a principal surface of the oxide semiconductor film be an m-plane, which enables exerting more excellent electrical properties. These preferable oxide semiconductor film may be obtained by the below-described preferable manufacturing method.

Preferably, the oxide semiconductor film may be obtained by atomizing a first raw material solution containing at least aluminum to generate first atomized droplets and atomizing a second raw material solution containing at least gallium and a dopant to generate second atomized droplets (atomization step), subsequently carrying the first atomized droplets into a film forming chamber using a first carrier gas and carrying the second atomized droplets into the film forming chamber using a second carrier gas (carrying step), and then mixing the first atomized droplets and the second atomized droplets in the film forming chamber and thermally reacting the mixed atomized droplets (mixture of the first atomized droplets and the second atomized droplets) in the vicinity of a surface of the base to form an oxide semiconductor film on the base (film forming step).

(Atomization Step)

In the atomization step, the raw material solutions are atomized to obtain atomized droplets. The atomized droplets may be mist. A method for the atomization is not specifically limited as long as the method enables atomization of the raw material solutions but may be a known method; however, in the present disclosure, an atomization method using ultrasound is preferable. Atomized droplets obtained using ultrasound are preferable because of having an initial velocity of zero and being suspended in air, and are atomized droplets that are not, for example, those sprayed via a sprayer but are suspended in space and may be carried as gas. Such atomized droplets are very preferable because of being not damaged by collision energy. A size of each of the atomized droplets is not specifically limited and may be around several millimeters, but is preferably no more than 50 µm, more preferably 100 nm to 10 µm.

(Raw Material Solutions)

In an embodiment of the present disclosure, the first raw material solution is not specifically limited as long as the first raw material solution contains at least aluminum, and may contain an inorganic material or may contain an organic material, but in an embodiment of the present disclosure, one obtained by dissolving or dispersing aluminum in an organic solvent or water in the form of a complex or a salt may suitably be used as the first raw material solution. Also, the second raw material solution is not specifically limited as long as the second raw material solution contains at least gallium and the dopant, and may contain an inorganic material or may contain an organic material, but in an embodiment of the present disclosure, one obtained by dissolving or dispersing the gallium and the dopant in an organic solvent or water in the form of a complex or a salt may suitably be used as the second raw material solution. Examples of the form of a complex include, e.g., acetylacetonate complexes, carbonyl complexes, ammine complexes and hydride complexes. Examples of the form of a salt include, e.g., organic metal salts (for example, metal acetate, metal oxalate, metal citrate, etc.), metal sulfide salt, metal nitrate salt, metal phosphate salt, metal halide salt (for example, metal chloride salt, metal bromide salt, metal iodide salt, etc.).

A solvent of each raw material solution is not specifically limited and may be an inorganic solvent such as water or may be an organic solvent such as alcohol or may be a mixed solution of an inorganic solvent and an organic solvent. In the present disclosure, it is preferable that the solvent contain water and it is also preferable that the solvent be a mixed solvent of water and an acid. More specific examples of the water include, e.g., pure water, ultrapure water, tap water, well water, mineral spring water, mineral water, hot spring water, spring water, fresh water and seawater, but in the present disclosure, ultrapure water is preferable. Also, more specific examples of the acid include, e.g., organic acids such as acetic acid, propionic acid and butane acid, boron trifluoride, boron trifluoride etherate, boron trichloride, boron tribromide, trifluoroacetic acid, trifluoromethanesulfonic acid, and p-toluenesulfonic acid.

(Base)

The base is not specifically limited as long as the base is possible to support the oxide semiconductor film. A material of the base is also not specifically limited as long as the material does not hinder the present disclosure, and may be a known base, and may be an organic compound or may be an inorganic compound. A shape of the base may be any shape and the base is effective in any and all shapes including, for example, plate-like shapes such as a flat plate and a circular plate, a fibrous shape, a rod-like shapes, a columnar shape, a prism shape, a tubular shape, a helical shape, a spherical shape and a ring-like shapes; however, in the present disclosure, a substrate is preferable. A thickness of the substrate is not specifically limited in the present disclosure.

The substrate is not specifically limited as long as the substrate does not hinder the object of the present disclosure, and may be an insulator substrate, may be a semiconductor substrate or may be an electrically conductive substrate. Examples of the substrate include, e.g., a base substrate containing a substrate material having a corundum structure as a major component. Here, the "major component" means that the substrate material having the particular crystal structure is contained at an atom ratio of preferably no less than 50%, more preferably no less than 70%, still more preferably no less than 90% to all components of the substrate material, and also means that the atom ratio may be 100%.

The substrate material is not specifically limited as long as the substrate material does not hinder the present disclosure and may be a known one. Preferable examples of the base substrate containing the substrate material having a corundum structure as a main component include, e.g., a sapphire substrate (preferably an m-plane sapphire substrate) and an α-gallium oxide substrate (preferably an m-plane α-gallium oxide substrate).

The base is a crystal substrate and preferably has an off angle of 0.2° to 12.0°. In a metal oxide containing gallium and aluminum and having a corundum structure, the gallium and the aluminum being contained at an atom ratio within the aforementioned preferable range and a carrier density within the aforementioned preferable range being provided enables provision of the oxide semiconductor film having a mobility of no less than 5 $cm^2/Vs$ and a band gap of no less than 5.5 eV.

(Carrying Step)

In the carrying step, the atomized droplets (the first atomized droplets and the second atomized droplets) are carried into the film forming chamber by the carrier gas (containing the first carrier gas and the second carrier gas). A type of the carrier gas is not specifically limited as long as the type of the carrier gas does not hinder the object of the present disclosure, and examples of the type of the carrier gas include, e.g., inert gases such as oxygen, ozone, nitrogen and argon and reducing gases such as hydrogen gas and forming gas; however, in the present disclosure, it is preferable to use oxygen as the carrier gas. Also, for the type of the carrier gas, a single type or two or more types of the carrier gas may be used, and, e.g., a dilute gas with a carrier gas concentration changed (for example, a 10-fold diluted gas). Also, the number of locations for supply of the carrier gas is not limited to one but may be two or more. A flow rate of the carrier gas is not specifically limited but is preferably 0.01 to 20 L/minute, more preferably 1 to 10 L/minute. In the case of a dilute gas, a flow rate of the dilute gas is preferably 0.001 to 2 L/minute, more preferably 0.1 to 1 L/minute.

(Film Forming Step)

In the film forming step, the atomized droplets (mixture of the first atomized droplets and the second atomized droplets) are thermally reacted in the vicinity of the surface of the base to form a film on a part or an entirety of the surface of the base. The thermal reaction is not specifically limited as long as the thermal reaction is a thermal reaction by which a film is formed from the atomized droplets, and it is only necessary that the atomized droplets react with heat, and conditions, etc., of the reaction are also not specifically limited as long as such conditions, etc., do not hinder the object of the present disclosure. In the present step, the thermal reaction is normally performed at a temperature that is equal to or exceeds an evaporation temperature of the solvent but preferably a temperature that is not too high. In the present disclosure, the thermal reaction is performed at preferably no more than 750° C., more preferably a temperature of 400° C. to 750° C. Also, the thermal reaction may be performed under any atmosphere of vacuum, a non-oxygen atmosphere, a reducing gas atmosphere and an oxygen atmosphere and may be performed under any condition of atmospheric pressure, increased pressure and reduced pressure as long as such atmosphere and condition do not hinder the object of the present disclosure; however, in the present disclosure, the thermal reaction is preferably performed under an oxygen atmosphere, is also preferably performed under atmospheric pressure, and is more preferably performed under an oxygen atmosphere and atmospheric pressure. Note that a thickness of the film may be set by adjusting film forming time, and in the present disclosure, it is preferable that the film thickness be no less than 500 nm.

In the present disclosure, the film may be formed directly on the base, but may be formed on the base via other layers such as a semiconductor layer having a composition that is different from a composition of the oxide semiconductor film (for example, an n-type semiconductor layer, a n+-type semiconductor layer, an n--type semiconductor layer, a p-type semiconductor layer, a p+-type semiconductor layer or a p--type semiconductor layer), an insulator layer (which may be a semi-insulator layer) and a buffer layer after the other layers being stacked on the base. Examples of the semiconductor layer and the insulator layer include, e.g., a semiconductor layer and an insulator layer containing the group 9 metals and/or group 13 metals mentioned above. Examples of the buffer layer include, e.g., a semiconductor layer, an insulator layer and an electrical conductor layer each including a corundum structure. Examples of the semiconductor layer including a corundum structure include, e.g., $\alpha$-$Fe_2O_3$, $\alpha$-$Ga_2O_3$, $\alpha$-$Al_2O_3$, $\alpha$-$Ir_2O_3$ and $\alpha$-$In_2O_3$ and mixed crystals thereof. Also, a method of stacking the buffer layer including a corundum structure is not specifically limited and may be similar to the aforementioned stacking method.

An oxide semiconductor film obtained in such a manner as described above may be used as a semiconductor layer in a semiconductor device. In particular, such oxide semiconductor film is useful for a power device. Also, semiconductor devices may be classified into horizontal devices with an electrode formed on one side of a semiconductor layer (horizontal devices) and vertical devices with an electrode on each of opposite, front and rear, sides of a semiconductor layer (vertical devices), and in the present disclosure, the oxide semiconductor film may suitably be used for a horizontal device and also for a vertical device, and among others, it is preferable to use the oxide semiconductor film for a vertical device. Examples of the semiconductor device include, e.g., s Schottky barrier diode (SBD), a metal semiconductor field-effect transistor (MESFET), a high-electron-mobility transistor (HEMT), a metal-oxide-semiconductor field-effect transistor (MOSFET), a static induction transistor (SIT), a junction-gate field-effect transistor (JFET), an insulated-gate bipolar transistor (IGBT) and a light-emitting diode.

FIGS. 4 to 8 each illustrate an example in which the oxide semiconductor film is used for a semiconductor layer.

Figure 4:
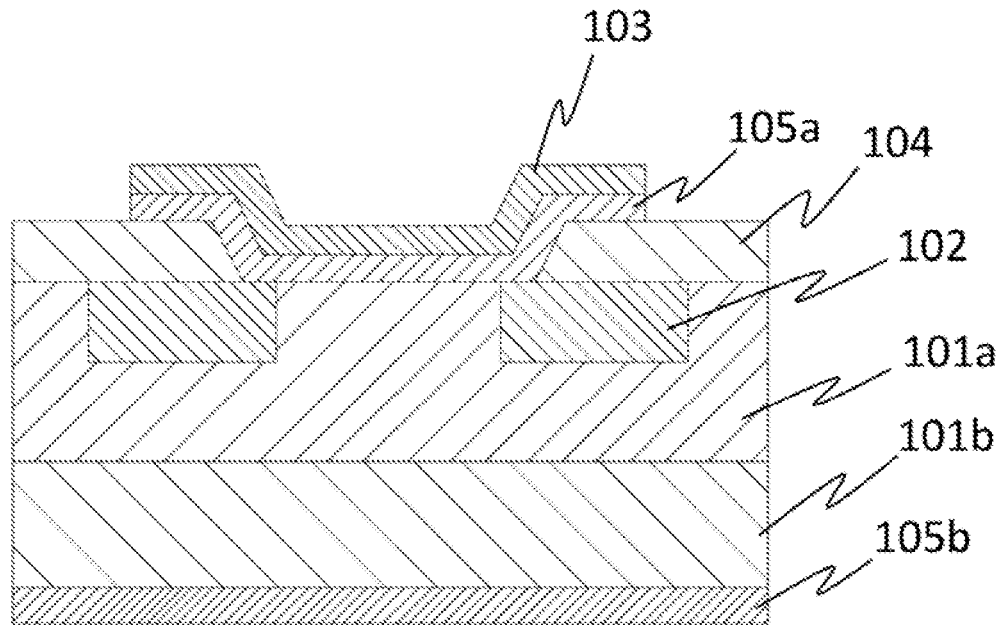
FIG. 4 is a diagram schematically illustrating a preferable example of a Schottky barrier diode (SBD) in the present disclosure.

FIG. 4 illustrates a preferable example of a Schottky barrier diode (SBD) including an n--type semiconductor layer 101a, an n+-type semiconductor layer 101b, a p-type semiconductor layer 102, a metal layer 103, an insulator layer 104, a Schottky electrode 105a and an ohmic electrode 105b. Note that the metal layer 103 is formed of a metal, for example, Al and covers the Schottky electrode 105a.

Figure 5:
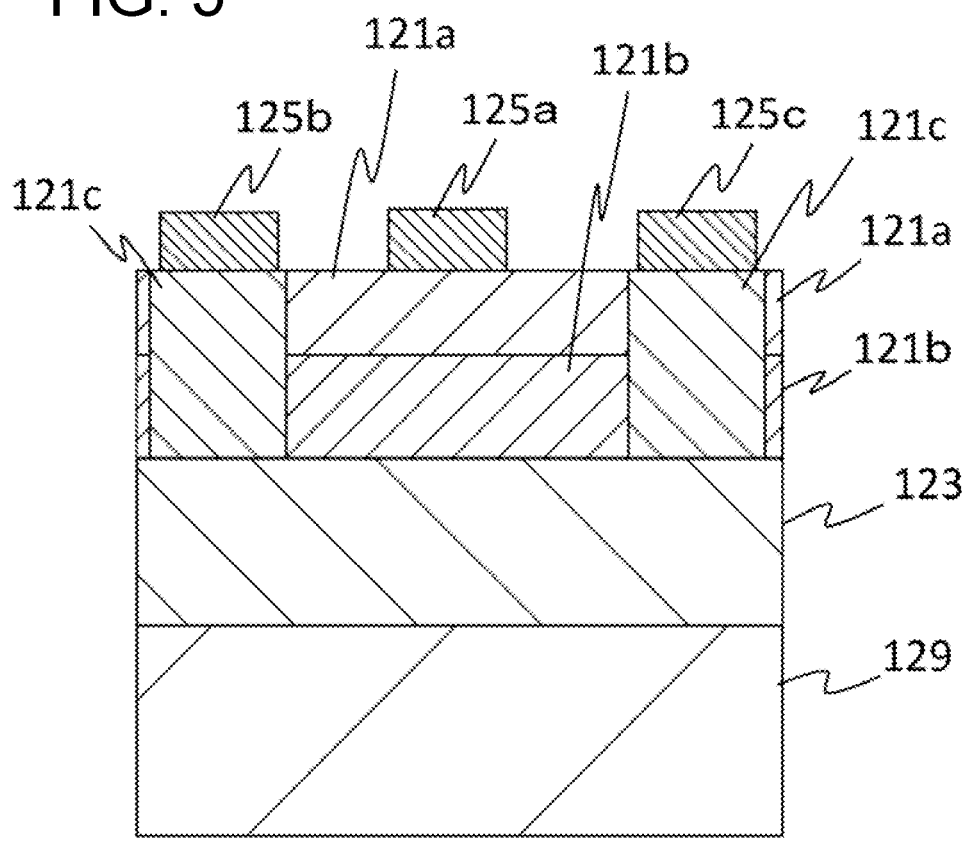
FIG. 5 is a diagram schematically illustrating a preferable example of a high-electron-mobility transistor (HEMT) in the present disclosure.

FIG. 5 illustrates a preferable example of a high-electron-mobility transistor (HEMT) including a wide-band-gap n-type semiconductor layer 121a, a narrow-band-gap n-type semiconductor layer 121b, an n+-type semiconductor layer 121c, a p-type semiconductor layer 123, a gate electrode 125a, a source electrode 125b, a drain electrode 125c and a substrate 129.

Figure 6:
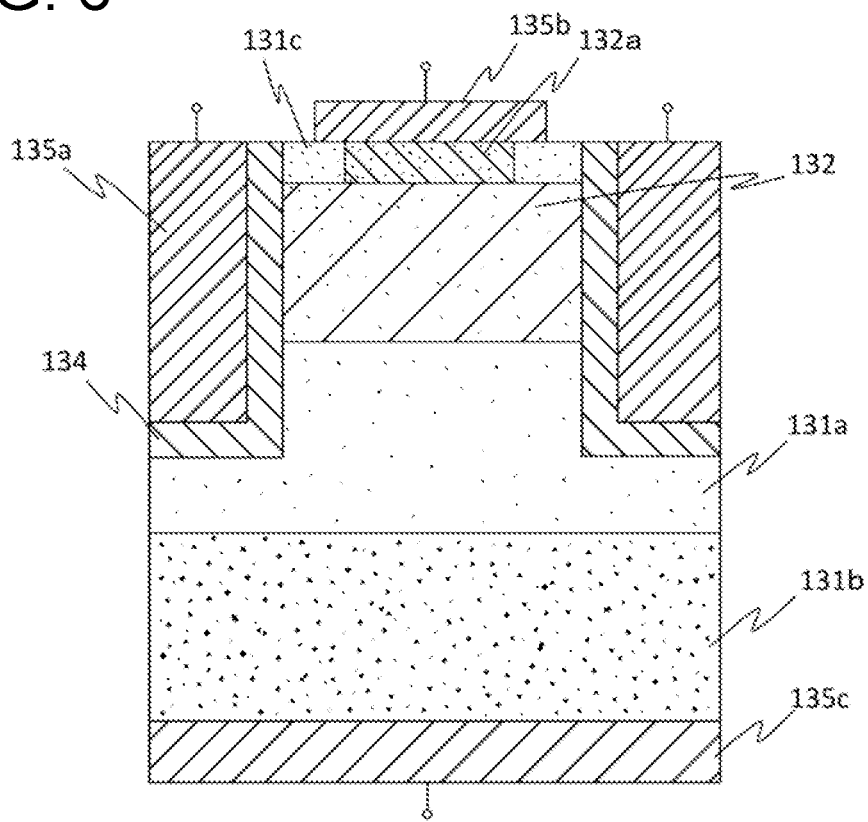
FIG. 6 is a diagram schematically illustrating a preferable example of a metal-oxide-semiconductor field-effect transistor (MOSFET) in the present disclosure.

FIG. 6 illustrates a preferable example of a metal-oxide-semiconductor field-effect transistor (MOSFET) including an n--type semiconductor layer 131a, a first n+-type semiconductor layer 131b, a second n+-type semiconductor layer 131c, a p-type semiconductor layer 132, a p+-type semiconductor layer 132a, a gate insulator film 134, a gate electrode 135a, a source electrode 135b and a drain electrode 135c. Note that the p+-type semiconductor layer 132a may be a p-type semiconductor layer and may also be the same as the p-type semiconductor layer 132.

Figure 7:
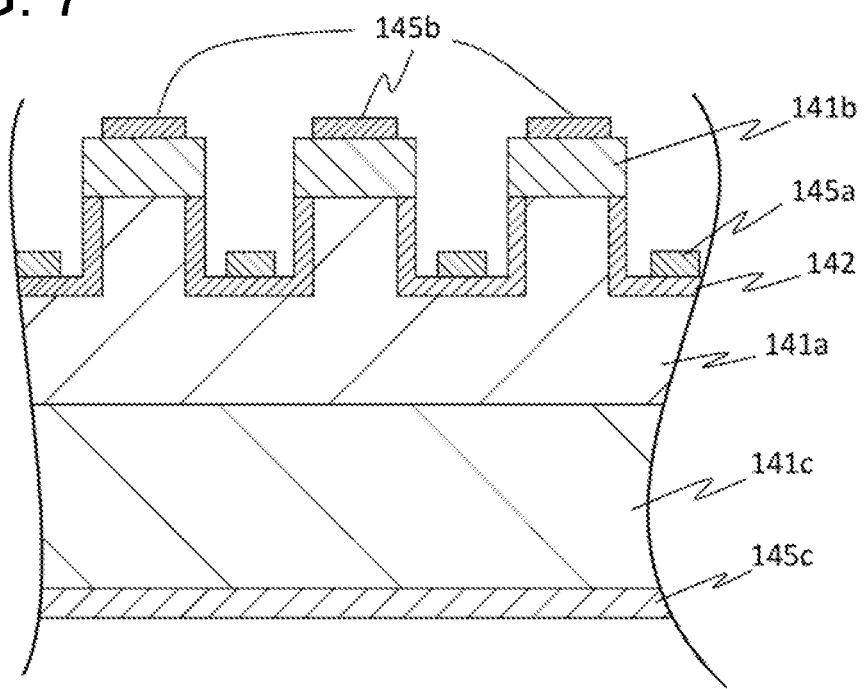
FIG. 7 is a diagram schematically illustrating a preferable example of a junction-gate field-effect transistor (JFET) in the present disclosure.

FIG. 7 illustrates a preferable example of a junction-gate field-effect transistor (JFET) including an n--type semiconductor layer 141a, a first n+-type semiconductor layer 141b, a second n+-type semiconductor layer 141c, a p-type semiconductor layer 142, a gate electrode 145a, a source electrode 145b and a drain electrode 145c.

Figure 8:
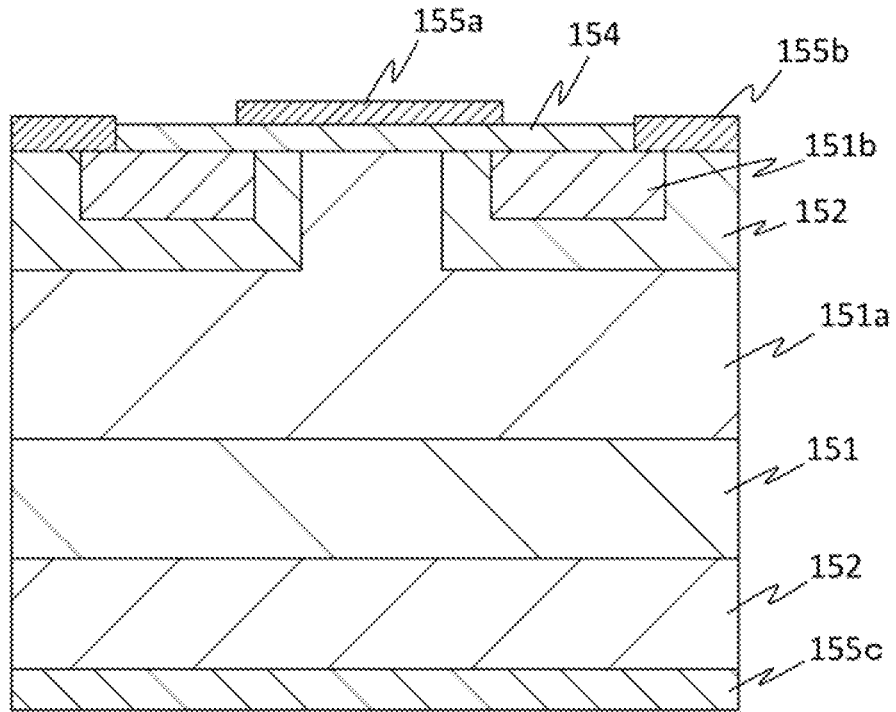
FIG. 8 is a diagram schematically illustrating a preferable example of an insulated-gate bipolar transistor (IGBT) in the present disclosure.

FIG. 8 illustrates a preferable example of an insulated-gate bipolar transistor (IGBT) including an n-type semiconductor layer 151, an n--type semiconductor layer 151a, an n+-type semiconductor layer 151b, a p-type semiconductor layer 152, a gate insulator film 154, a gate electrode 155a, an emitter electrode 155b and a collector electrode 155c.

(LED)

Figure 9:
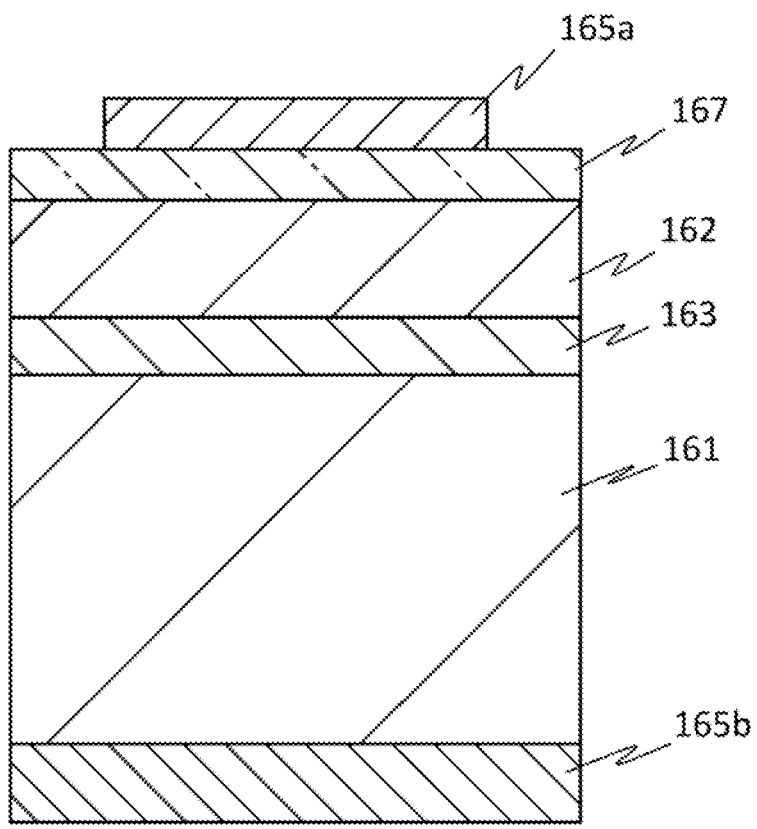
FIG. 9 is a diagram schematically illustrating a preferable example of a light-emitting device (LED) in the present disclosure.

FIG. 9 illustrates an example of a case where a semiconductor device of the present disclosure is a light-emitting diode (LED). The semiconductor light-emitting device in FIG. 9 includes an n-type semiconductor layer 161 on a second electrode 165b, and a light-emitting layer 163 is stacked on the n-type semiconductor layer 161. A p-type semiconductor layer 162 is stacked on the light-emitting layer 163. A light-transmissive electrode 167 that transmits light generated by the light-emitting layer 163 is provided on the p-type semiconductor layer 162 and a first electrode 165a is stacked on the light-transmissive electrode 167. Note that the semiconductor light-emitting device in FIG. 9 may be covered by a protective layer except the electrode part.

Examples of a material of the light-transmissive electrode include, e.g., conductive materials of oxides containing indium (In) or titanium (Ti). More specific examples of the material include, e.g., $In_2O_3$, ZnO, $SnO_2$, $Ga_2O_3$, $TiO_2$, $CeO_2$, mixed crystals of any two or more thereof and these materials subjected to doping. The light-transmissive electrode may be formed by providing any of these materials via a known method such as sputtering. Also, after formation of the light-transmissive electrode, thermal annealing for making the light-transmissive electrode transparent may be performed.

According to the semiconductor light-emitting device of FIG. 9, with the first electrode 165a as a positive electrode and the second electrode 165b as a negative electrode, current is made to flow to the p-type semiconductor layer 162, the light-emitting layer 163 and the n-type semiconductor layer 161 via these electrodes to make the light-emitting layer 163 emit light.

Examples of materials of the first electrode 165a and the second electrode 165b include, e.g., metals such as Al, Mo, Co, Zr, Sn, Nb, Fe, Cr, Ta, Ti, Au, Pt, V, Mn, Ni, Cu, Hf, W, Ir, Zn, In, Pd, Nd and Ag and alloys thereof, electrically conductive films of metal oxides such as tin oxide, zinc oxide, indium oxide, indium tin oxide (ITO), indium zinc oxide (IZO), and organic electrically conductive compounds such as polyaniline, polythiophene and polypyrrole and mixtures thereof. A film forming method for each electrode is not specifically limited, and each electrode may be formed on the substrate according to a method appropriately selected in consideration of suitability for the material from among wet methods such as a printing method, a spraying method, a coating method, physical methods such as a vacuum vapor deposition method, a sputtering method, an ion plating method, chemical methods such as CVD and plasma CVD methods.

Figure 10:
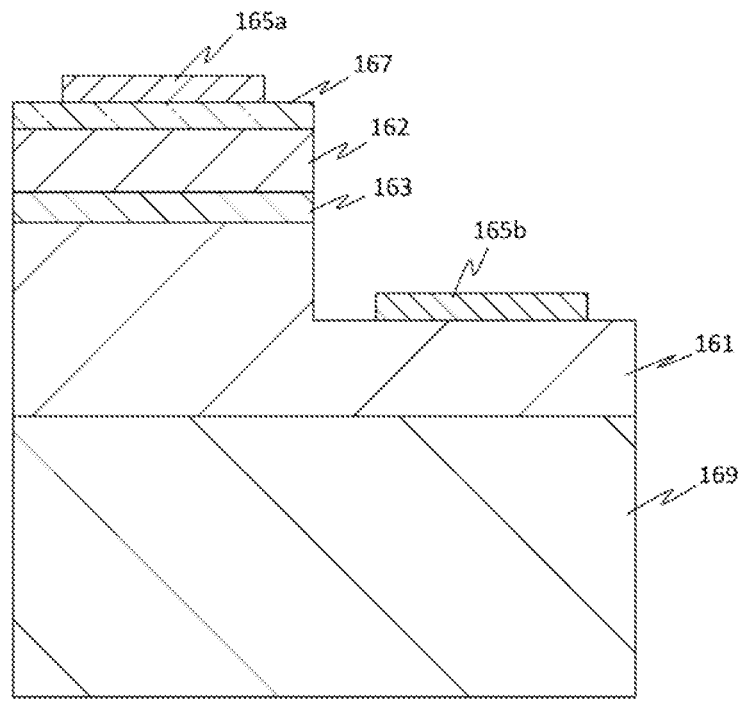
FIG. 10 is a diagram schematically illustrating a preferable example of a light-emitting device (LED) in the present disclosure.

FIG. 10 illustrates another embodiment of a light-emitting device. In the light-emitting device of FIG. 10, an n-type semiconductor layer 161 is stacked on a substrate 169, and a second electrode 165b is stacked on a part of an exposed semiconductor layer surface of the n-type semiconductor layer 161, the exposed semiconductor layer surface being exposed by partially cutting out a p-type semiconductor layer 162, a light-emitting layer 163 and the n-type semiconductor layer 161.

Figure 11:
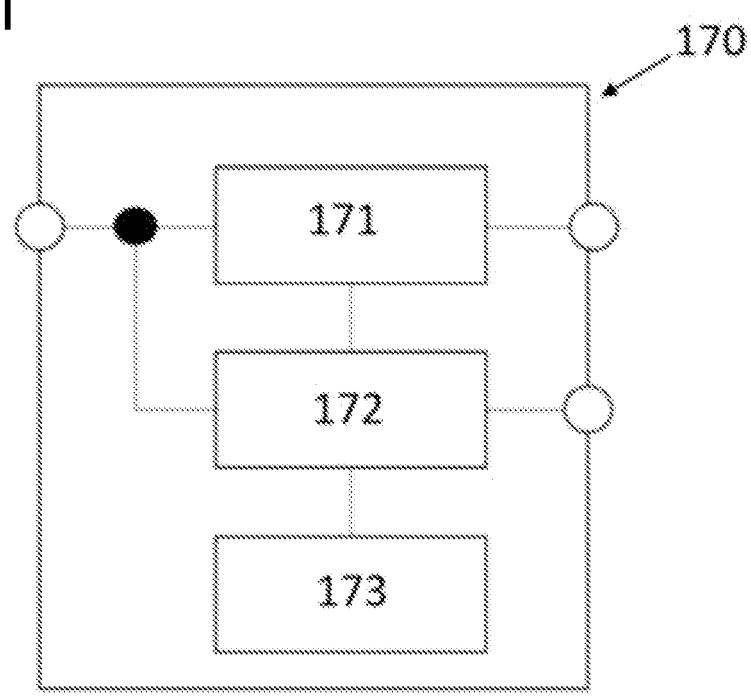
FIG. 11 is a diagram schematically illustrating a preferable example of a power supply system in the present disclosure.
Figure 12:
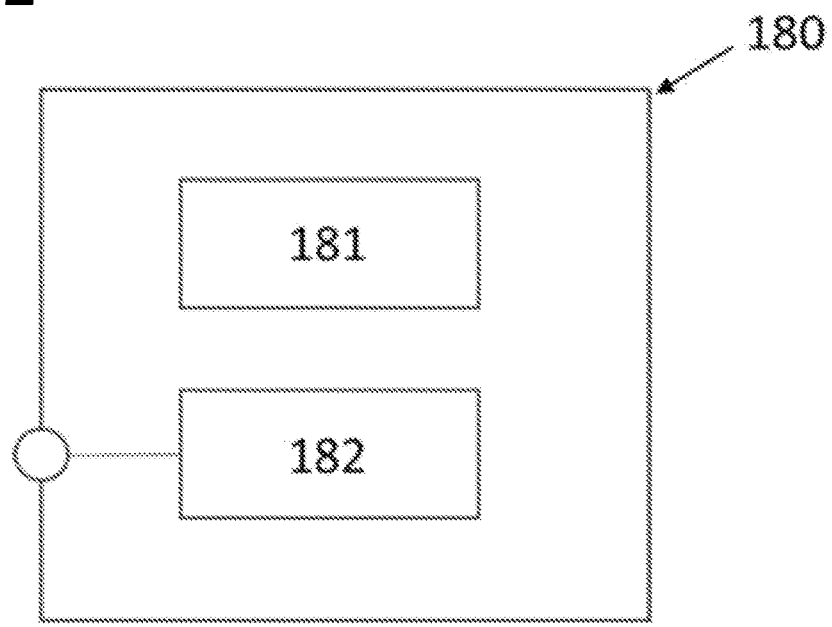
FIG. 12 is a diagram schematically illustrating a preferable example of a system device in the present disclosure.
Figure 13:
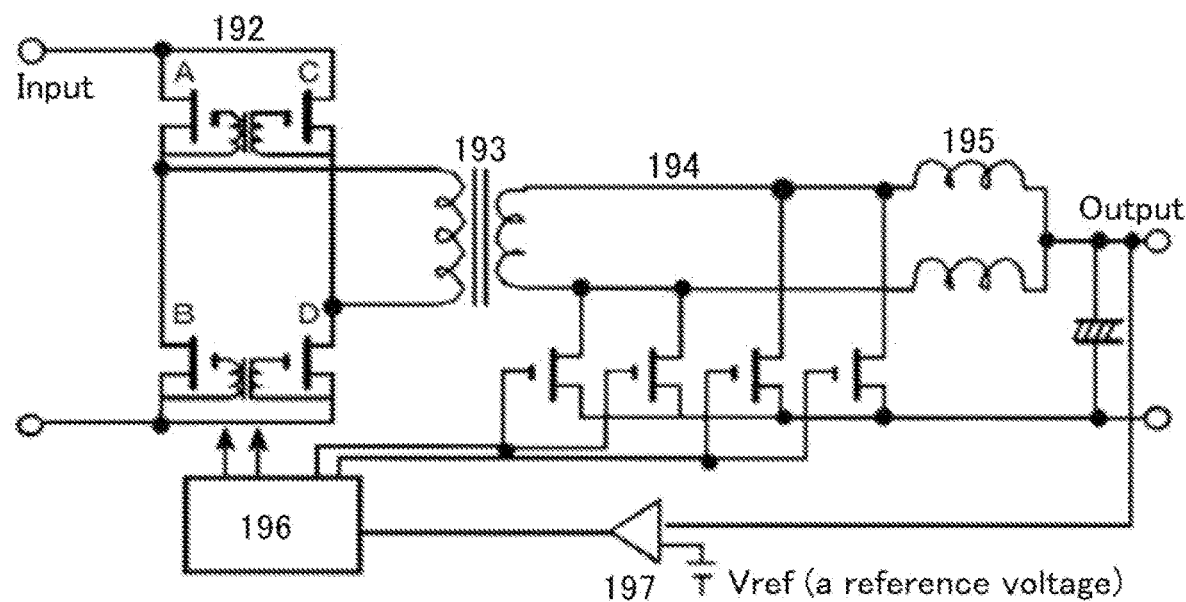
FIG. 13 is a diagram schematically illustrating a preferable example of a power supply circuit of a power supply device in the present disclosure.

In addition to the above-described matters, the semiconductor device of the present disclosure is suitably used as a power module, an inverter or a converter using a known method, and furthermore, is suitably used for, for example, a semiconductor system using a power supply device. The power supply device may be fabricated from the semiconductor device or as the semiconductor device, by, for example, being connected to, e.g., a wiring pattern via an ordinary method. In FIG. 11, a power supply system 170 is configured by using a plurality of the power supply devices 171, 172 and a control circuit 173. As illustrated in FIG. 12, the power supply system may be used for a system device 180 by combining an electronic circuit 181 and a power supply system 182. FIG. 13 illustrates an example of a power supply circuit diagram of a power supply device. FIG. 13 illustrates a power supply circuit of a power supply device including a power circuit and a control circuit, in which a DC voltage is switched into AC at a high frequency by an inverter 192 (configured by MOSFETs A to D), and is then subjected to insulation and transformation in a transformer 193, rectified by rectifying MOSFETs 194 (A to B') and then smoothed by a DCL 195 (smoothing coils L1, L2) and a capacitor to output a direct-current voltage. At this time, the output voltage is compared with a reference voltage in a voltage comparator 197, and the inverter 192 and the rectifying MOSFETs 194 are controlled by a PWM control circuit 196 so that the output voltage becomes a desired output voltage.

Figure 14:
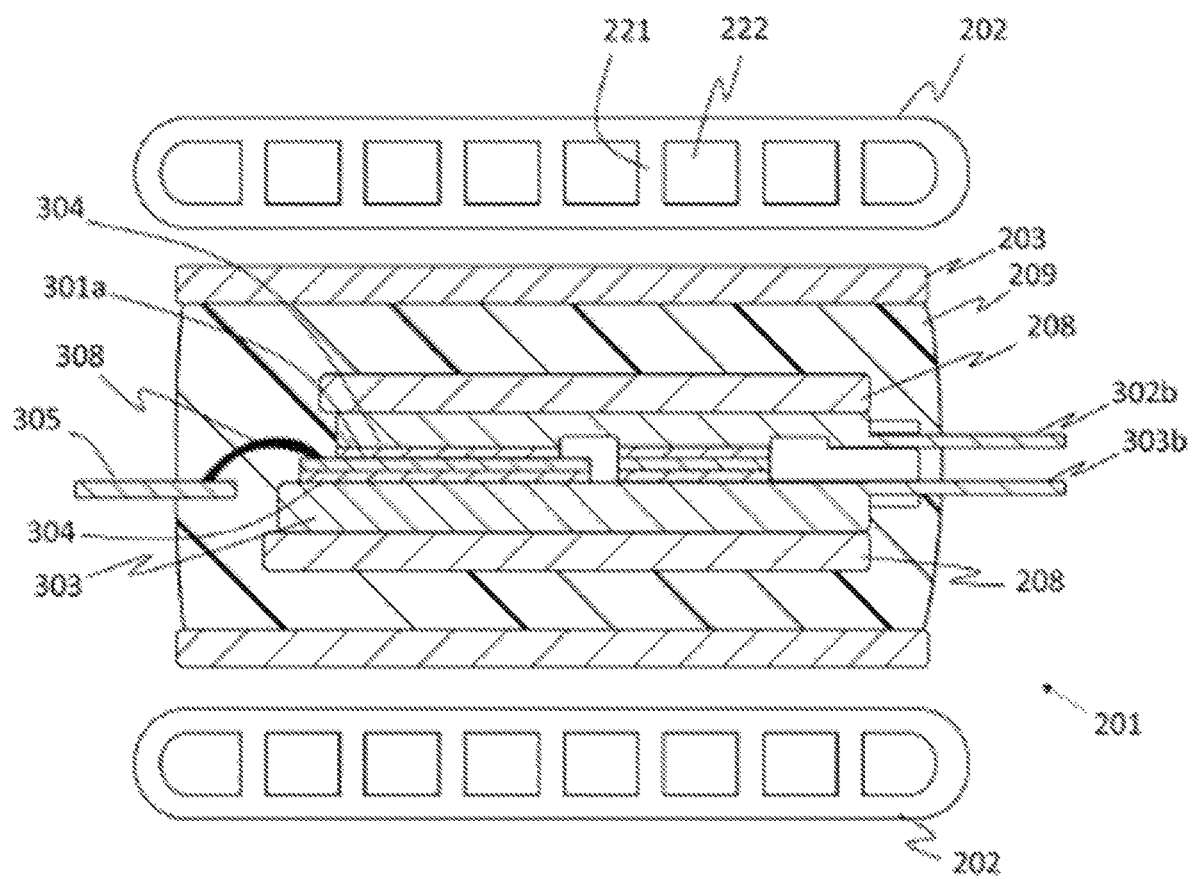
FIG. 14 is a diagram schematically illustrating a preferable example of a power card in the present disclosure.

In the present disclosure, the semiconductor device is preferably a power card, more preferably includes coolers and insulating members in such a manner that the coolers are provided on opposite sides of the semiconductor layer via at least the insulating members, respectively, most preferably include a heat dissipation layer on each of opposite sides of the semiconductor layer in such a manner that the coolers are provided on outer sides of the heat dissipation layer via at least the insulating members, respectively. FIG. 14 illustrates a power card, which is one of the preferable embodiments of the present disclosure. The power card in FIG. 14 is a double-sided cooling-type power card 201 including a refrigerant tube 202, a spacer 203, an insulating plate (insulating spacer) 208, an encapsulating resin portion 209, a semiconductor chip 301a, a metal heat transfer plate (projecting terminal portion) 302b, a heatsink and an electrode 303, a metal heat transfer plate (projecting terminal portion) 303b, a solder layer 304, a control electrode terminal 305 and a bonding wire 308. In a section in a thickness direction of the refrigerant tube 202, numerous flow channels 222 defined by numerous partitioning walls 221 extending in a flow channel direction in such a manner as to be spaced a predetermined distance from one another are provided. Such preferable power card as above enables providing higher heat dissipation and thus enables ensuring higher reliability.

EXAMPLES

1. Film Forming Apparatus

A mist CVD (mist chemical vapor deposition) apparatus (1) used in the present example will be described with reference to FIG. 1. The mist CVD apparatus (1) includes at least carrier gas sources (2a, 12a) that each supply a carrier gas, flow control valves (3a, 13a) for each controlling a flow rate of the carrier gas fed from the relevant carrier gas source (2a, 12a), mist generation sources (4, 14) that each receive a raw material solution (4a, 14a), containers (5, 15) that each receive water (5a, 15a), ultrasound transducers (6, 16) each attached to a bottom surface of the relevant container (5, 15), a film forming chamber (7), supply pipes (9, 19) that each provide connection between the relevant mist generation source (4, 14) and the vicinity of a substrate (10), and a hot plate (8) installed in the film forming chamber (7). The substrate (10) is placed on the hot plate (8). Also, there are two types of raw material solutions (4a, 14a), and a carrier gas source (2a, 12a), a carrier gas (dilute) source (2b, 12b), flow control valves (3a, 3b, 13a, 13b), a mist generation source (4, 14), a container (5, 15), an ultrasound transducer (6, 16) and a supply pipe (9, 19) are provided for each raw material solution. The raw material solutions (4a, 14a) are the first raw material solution 4a and the second raw material solution 14a and mist of the first raw material solution and mist of the second raw material solution are mixed in the film forming chamber 7.

2. Preparation of Raw Material Solution

A first raw material solution was prepared by mixing 2% by volume of hydrochloric acid into 0.15 mol/L of an aluminum acetylacetonate aqueous solution. Also, a second raw material solution was prepared by mixing 2% of hydrochloric acid into 0.05 mol/L of a gallium acetylacetonate aqueous solution and further adding tin bromide ($SnBr_2$) to the resulting solution at a ratio of 0.1 mol % relative to gallium.

3. Preparation for Film Forming

The first raw material solution 4a obtained in "2" above was put in the first mist generation source 4. Also, the second raw material solution 14a was put in the second mist generation source 14. Next, as the substrate 10, an m-plane (having an off angle of 2°) sapphire substrate was placed on the hot plate 8, and the hot plate 8 was activated to increase a temperature of the substrate to 650° C. Next, the first flow control valves 3a, 3b and the second flow control valves 13a, 13b were each opened to supply carrier gases from the first carrier gas sources 2a, 2b and the second carrier gas source 12a, 12b, which are carrier gas sources, into the film forming chamber 7, respectively, and after sufficient replacement of atmosphere of the film forming chamber 7 with the carrier gases, a flow rate of the first carrier gas was controlled to 0.7 L/minute and the first carrier gas (dilute) was controlled to 0.5 L/minute, and a flow rate of the second carrier gas was controlled to 1 L/minute and a flow rate of the second carrier gas (dilute) was controlled to 0.5 L/minute. For the carrier gases, nitrogen was used.

4. Film Forming

Next, the ultrasound transducer 6 was vibrated at 2.4 MHz and the vibration was propagated to the raw material solution 4a via the water 5a to atomize the first raw material solution 4a to generate first mist 4b. Likewise, the ultrasound transducer 16 was vibrated at 2.4 MHz and the vibration was propagated to the second raw material solution 14a via the water 15a to atomize the second raw material solution 14a to generate second mist 14b. The first mist 4b was introduced into the film forming chamber 7 through the inside of the supply pipe 9 by the carrier gas, the second mist 14b was introduced into the film forming chamber 7 through the inside of the supply pipe 19 by the carrier gas, and the first mist 4b and the second mist 14b are mixed in the film forming chamber 7. The mixed mist in the film forming chamber 7 was thermally reacted at 650° C. under atmospheric pressure, and a film was thus formed on the substrate 10. Time of the film forming was 2 hours. A film thickness of the obtained film was 750 nm.

Figure 2:
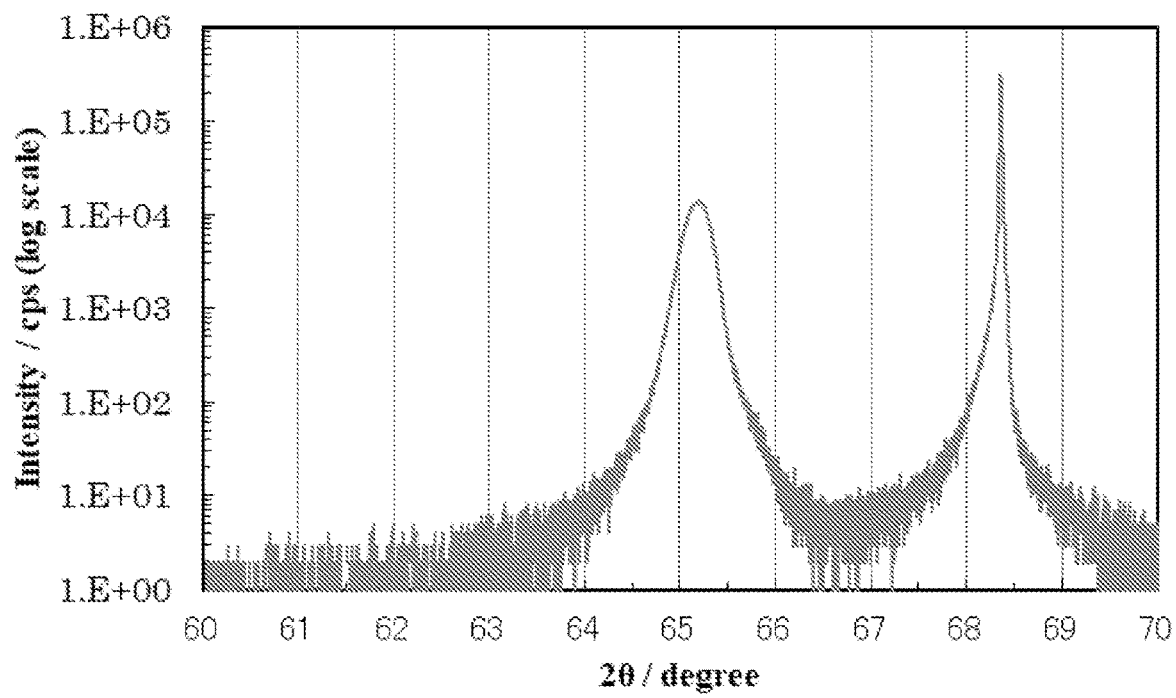
FIG. 2 is a graph indicating an XRD (X-ray diffraction) measurement result in example 1 of the present disclosure.

As a result of identification of the film obtained in "4" above using an X-ray diffraction apparatus, it was found out that the obtained film was an $(Al_{0.11}Ga_{0.89})_2O_3$ film having a corundum structure. FIG. 2 indicates an XRD measurement result. As a result of Hall effect measurement of the obtained $\alpha$-$(Al_{0.11}Ga_{0.89})_2O_3$ film, it was found out that a carrier type was an n-type, a carrier density was $1.37\times10^{18}$ (/cm$^3$) and a mobility was 5.91 (cm$^2$/V·s). Also, the obtained film was a film including a principal surface that is an m-plane and having an off angle in an $\alpha$-axis direction.

Example 2

Figure 3:
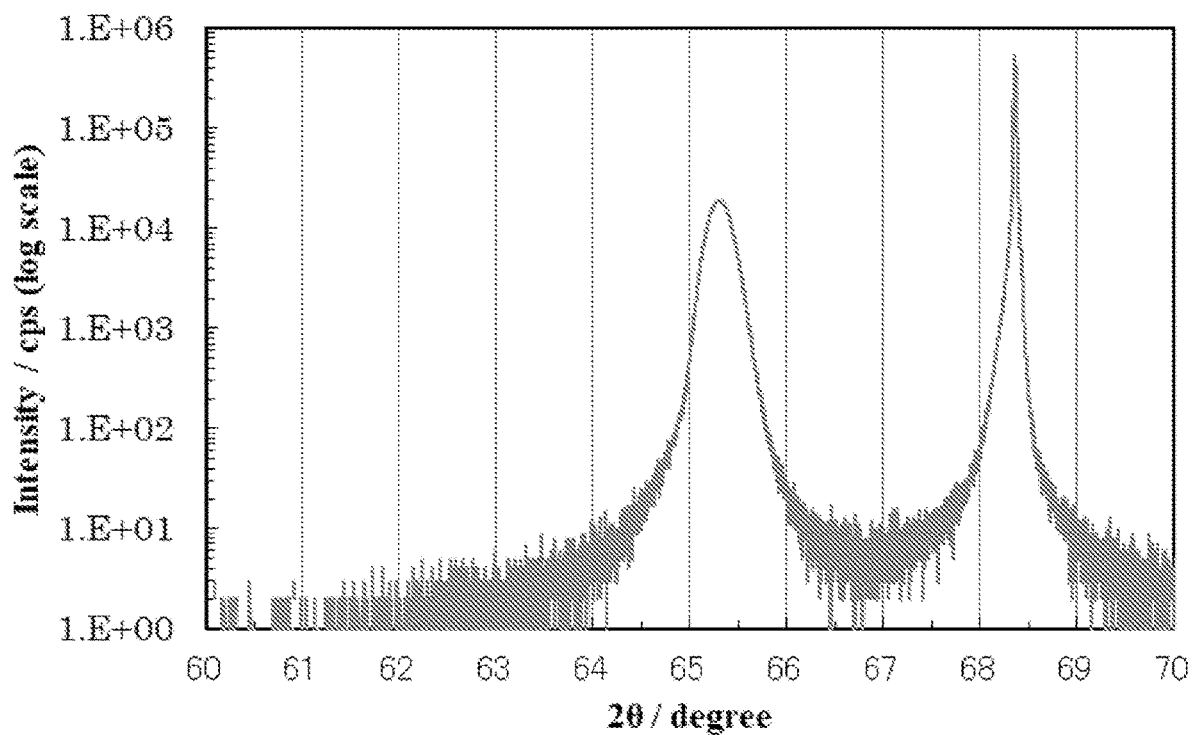
FIG. 3 is a graph indicating an XRD measurement result in example 2 of the present disclosure.

A film was formed in a manner that is similar to that of example 1 except that a flow rate of first carrier gas was 0.5 L/minute and film forming time was 3 hours. A thickness of the obtained film was 1310 nm. As a result of identification of the obtained film using an X-ray diffraction apparatus, it was found out that the obtained film is an $(Al_{0.15}Ga_{0.85})_2O_3$ film having a corundum structure. FIG. 3 indicates an XRD measurement result. Electrical properties of the obtained $\alpha$-$(Al_{0.15}Ga_{0.85})_2O_3$ film were similar to those of example 1: a carrier type was an n-type and a carrier density and a mobility were similar to those of example 1. A band gap of the obtained film was 5.5 eV. The band gap was calculated from a peak of electrons elastically scattered (no energy lost) and a peak of electrons not elastically scattered (amount of energy for interband excitation lost), using reflection electron energy loss spectroscopy (REELS). Also, the obtained film was a film including a principal surface that is an m-plane and having an off angle in an $\alpha$-axis direction.

Test Example 3

A film was formed in a manner that is similar to that of example 1 except that film forming time was 1 hour, a solution obtained by mixing 2% of hydrochloric acid into 0.05 mol/L of a gallium acetylacetonate aqueous solution was used as a second raw material solution and a flow rate of first carrier gas was 1.0 L/minute. A thickness of the obtained film was 362 nm. As a result of identification of the obtained film using an X-ray diffraction apparatus, it was found out that the obtained film was an $(Al_{0.20}Ga_{0.80})_2O_3$ film having a corundum structure. A band gap, which was calculated via a method that was similar to that of example 2, was 5.8 eV. Also, the obtained film was a film including a principal surface that is an m-plane and having an off angle in an $\alpha$-axis direction.

Test Example 4

A film was formed in a manner that is similar to that of example 1 except that a temperature of a substrate was 700° C., film forming time was 1 hour, a solution obtained by mixing 2% of hydrochloric acid into 0.05 mol/L of a gallium acetylacetonate aqueous solution was used as a second raw material solution and a flow rate of second carrier gas was 0.5 L/minute. As a result of identification of the obtained film using an X-ray diffraction apparatus, it was found out that the obtained film was an $(Al_{0.50}Ga_{0.50})_2O_3$ film having a corundum structure. A band gap, which was calculated via a method that was similar to that of example 2, was 6.1 eV. Also, the obtained film was a film including a principal surface that is an m-plane and having an off angle in an $\alpha$-axis direction.

An oxide semiconductor film of the present disclosure is useful as a semiconductor and may be used for any and all fields such as semiconductors (for example, compound semiconductor electronic devices), electronic components and electric equipment components, optical/electronic photograph-related devices and industrial members, and is particularly useful for semiconductor devices and the like because of having excellent semiconductor properties.

The embodiments of the present invention are exemplified in all respects, and the scope of the present invention includes all modifications within the meaning and scope equivalent to the scope of claims.

REFERENCE SIGNS LIST 1 mist CVD apparatus
2a first carrier gas source
2b first carrier gas (dilute) source
3a first flow control valve
3b first flow control valve
4 first mist generation source
4a first raw material solution
4b first mist
5 first container
5a first water
6 ultrasound transducer
7 film forming chamber
8 hot plate
9 supply pipe
10 substrate
11 outlet
12a second carrier gas source
12b second carrier gas (dilute) source
13a second flow control valve
13b second flow control valve
14 second mist generation source
14a second raw material solution
14b second mist
15 second container
15a second water
101a n--type semiconductor layer
101b n+-type semiconductor layer
102 p-type semiconductor layer
103 metal layer
104 insulator layer
105a Schottky electrode
105b ohmic electrode
121a wide-band-gap n-type semiconductor layer
121b narrow-band-gap n-type semiconductor layer
121c n+-type semiconductor layer
123 p-type semiconductor layer
125a gate electrode
125b source electrode
125c drain electrode
128 buffer layer 129 substrate
131a n--type semiconductor layer
131b first n+-type semiconductor layer
131c second n+-type semiconductor layer
132 p-type semiconductor layer
134 gate insulator film
135a gate electrode
135b source electrode
135c drain electrode
138 buffer layer
139 semi-insulator layer
141a n--type semiconductor layer
141b first n+-type semiconductor layer
141c second n+-type semiconductor layer
142 p-type semiconductor layer
145a gate electrode
145b source electrode
145c drain electrode
151 n-type semiconductor layer
151a n--type semiconductor layer
151b n+-type semiconductor layer
152 p-type semiconductor layer
154 gate insulator film
155a gate electrode
155b emitter electrode
155c collector electrode
161 n-type semiconductor layer
162 p-type semiconductor layer
163 light-emitting layer
165a first electrode
165b second electrode
167 light-transmissive electrode
169 substrate
201 double-sided cooling-type power card
202 refrigerant tube
203 spacer
208 insulating plate (insulating spacer)
209 encapsulating resin portion
221 partitioning wall
222 flow channel
300 semiconductor device
301a semiconductor chip
302b metal heat transfer plate (projecting terminal portion)
303 heatsink and electrode
303b metal heat transfer plate (projecting terminal portion)
304 solder layer
305 control electrode terminal
308 bonding wire

What is claimed is:

1. A semiconductor device comprising:
a first oxide semiconductor film; and
a second oxide semiconductor film,
wherein the first oxide semiconductor film comprises a metal oxide as a major component and contains at least aluminum and gallium,
wherein the first oxide semiconductor film is a first-type semiconductor and the second oxide semiconductor film is a second-type semiconductor that is different from the first-type semiconductor,
wherein a mobility of the first oxide semiconductor film is no less than 5 cm$^2$/Vs, and
wherein the semiconductor device is a metal-oxide semiconductor field-effect transistor (MOSFET).

2. The semiconductor device according to claim 1, wherein the first oxide semiconductor film further comprises a dopant.

3. The semiconductor device according to claim 1, wherein the first oxide semiconductor film has a film thickness of no less than 500 nm.

4. The semiconductor device according to claim 1, wherein the first oxide semiconductor film has a corundum structure.

5. The semiconductor device according to claim 1, wherein an amount of the aluminum contained in the first oxide semiconductor film is no less than 1 atom % relative to the gallium contained in the first oxide semiconductor film.

6. The semiconductor device according to claim 1, wherein an amount of the aluminum contained in the first oxide semiconductor film is no less than 5 atom % relative to the gallium contained in the first oxide semiconductor film.

7. The semiconductor device according to claim 2, wherein the dopant is an n-type dopant.

8. The semiconductor device according to claim 4, wherein a principal surface of the first oxide semiconductor film is an m-plane.

9. The semiconductor device according to claim 1, wherein the first oxide semiconductor film has a band gap of no less than 5.5 eV.

10. A semiconductor system comprising a semiconductor device, wherein the semiconductor device is the semiconductor device according to claim 1.

11. The semiconductor device according to claim 1, wherein the first oxide semiconductor film is an n-type oxide semiconductor film and the second oxide semiconductor film is a p-type oxide semiconductor film.

12. The semiconductor device according to claim 1, wherein the first oxide semiconductor film contains an n-type dopant and the second oxide semiconductor film contains a p-type dopant.

* * * * *